(12) United States Patent
Neugebauer et al.

(10) Patent No.: US 10,699,984 B2
(45) Date of Patent: Jun. 30, 2020

(54) SEMICONDUCTOR MODULE WITH A SUPPORTING STRUCTURE ON THE BOTTOM SIDE

(71) Applicant: SIEMENS AKTIENGESELLSCHAFT, München (DE)

(72) Inventors: Stephan Neugebauer, Erlangen (DE); Stefan Pfefferlein, Heroldsberg (DE); Ronny Werner, Nürnberg (DE)

(73) Assignee: SIEMENS AKTIENGESELLSCHAFT, München (DE)

(*) Notice: Subject to any disclaimer, the term of this patent is extended or adjusted under 35 U.S.C. 154(b) by 0 days.

(21) Appl. No.: 16/471,472

(22) PCT Filed: Dec. 15, 2017

(86) PCT No.: PCT/EP2017/082992
§ 371 (c)(1),
(2) Date: Jun. 19, 2019

(87) PCT Pub. No.: WO2018/114651
PCT Pub. Date: Jun. 28, 2018

(65) Prior Publication Data
US 2019/0393122 A1    Dec. 26, 2019

(30) Foreign Application Priority Data

Dec. 20, 2016    (EP) .................................... 16205389

(51) Int. Cl.
*H01L 23/367*    (2006.01)
*H01L 23/373*    (2006.01)

(52) U.S. Cl.
CPC ........ *H01L 23/367* (2013.01); *H01L 23/3735* (2013.01)

(58) Field of Classification Search
CPC ............... H01L 23/367; H01L 23/3735; H01L 23/49816; H01L 2924/15311; H01L 2924/15321; H01L 2924/15331
(Continued)

(56) References Cited

U.S. PATENT DOCUMENTS 5,834,848 A * 11/1998 Iwasaki ................. H01L 21/563
257/778
5,866,953 A *  2/1999 Akram .................. H01L 21/563
257/687

(Continued)

FOREIGN PATENT DOCUMENTS

DE    102004019442 A1    10/2005
DE    112015000141 T5    5/2016
(Continued)

OTHER PUBLICATIONS

"PCT International Search Report and Written Opinion of International Searching Authority dated Nov. 4, 2018 corresponding to PCT International Application No. PCT/EP2017/082992 filed Dec. 15, 2017".

*Primary Examiner* — Timothy J Thompson
*Assistant Examiner* — Michael F McAllister
(74) *Attorney, Agent, or Firm* — Henry M. Feiereisen LLC

(57) ABSTRACT

A semiconductor module includes a substrate composed of electrically insulating material. A structured metal layer for contact with an electrical component is applied to a top side of the substrate. The structured metal layer is applied to the substrate only in a central region of the substrate, so that an edge region which surrounds the central region and in which the structured metal layer is not applied to the substrate remains on the top side of the substrate. A contact layer for making contact with a cooling body is situated opposite the structured metal layer and applied to a bottom side of the (Continued)

substrate in the central region. A structured supporting structure is further applied to the bottom side of the substrate in the edge region and has a thickness which corresponds to a thickness of the contact layer.

9 Claims, 2 Drawing Sheets

(58) Field of Classification Search
USPC .......................... 174/252; 257/720, 692, 698
See application file for complete search history.

(56) References Cited

U.S. PATENT DOCUMENTS

| | | | | |
|---|---|---|---|---|
| 6,046,499 A * | 4/2000 | Yano | H01L 23/3677 | 257/712 |
| 6,125,042 A * | 9/2000 | Verdi | H01L 23/552 | 257/737 |
| 6,194,782 B1 * | 2/2001 | Katchmar | H01L 23/49838 | 257/718 |
| 6,346,679 B1 * | 2/2002 | Nakamura | H01L 23/49816 | 174/259 |
| 6,400,019 B1 * | 6/2002 | Hirashima | H01L 23/49816 | 257/737 |
| 6,670,704 B1 * | 12/2003 | Neftin | H01L 23/49827 | 257/696 |
| 6,707,145 B2 * | 3/2004 | Pollock | H01L 23/50 | 257/684 |
| 6,727,718 B2 * | 4/2004 | Ichihara | H01L 23/49816 | 257/E23.069 |
| 7,053,493 B2 * | 5/2006 | Kanda | H01L 23/562 | 257/783 |
| 7,123,480 B1 * | 10/2006 | Andoh | H01L 23/3128 | 361/704 |
| 7,400,502 B2 * | 7/2008 | Hamman | H01L 23/473 | 165/80.3 |
| 7,608,921 B2 * | 10/2009 | Pendse | H01L 21/563 | 257/686 |
| 7,781,882 B2 * | 8/2010 | Zhong | H01L 23/3128 | 257/707 |
| 7,923,826 B2 * | 4/2011 | Takahashi | H01L 21/561 | 257/675 |
| 7,982,307 B2 * | 7/2011 | Amin | H01L 23/13 | 257/712 |
| 8,022,534 B2 * | 9/2011 | Wang | H01L 23/3675 | 257/712 |
| 8,358,002 B2 * | 1/2013 | Sutardja | H01L 23/13 | 257/670 |
| 2003/0168256 A1 * | 9/2003 | Chien | H01L 24/82 | 174/264 |
| 2004/0212072 A1 * | 10/2004 | Wu | H01L 23/3107 | 257/690 |
| 2006/0081978 A1 * | 4/2006 | Huang | H01L 21/4871 | 257/706 |
| 2007/0235884 A1 * | 10/2007 | Hsu | H01L 21/563 | 257/778 |
| 2009/2135460 | 8/2009 | Bharathan | | |
| 2010/0328917 A1 * | 12/2010 | Matsumura | H01L 24/11 | 361/783 |
| 2010/3027410 | 12/2010 | Hohlfeld | | |
| 2012/0175763 A1 * | 7/2012 | Harvey | H01L 23/13 | 257/692 |
| 2013/0561850 | 3/2013 | Bayerer | | |
| 2014/2045330 | 7/2014 | Abeyasekera | | |
| 2015/0318230 A1 * | 11/2015 | Bhagavat | H01L 23/467 | 361/694 |
| 2016/0021729 A1 * | 1/2016 | Nagatomo | B23K 20/023 | 361/748 |
| 2016/0148864 A1 * | 5/2016 | Fu | H01L 24/73 | 257/692 |
| 2016/0190034 A1 | 6/2016 | Okamotoa | | |
| 2016/0217290 A1 | 7/2016 | Roth et al. | | |
| 2017/0170098 A1 * | 6/2017 | Vreman | H05K 1/0268 | |

FOREIGN PATENT DOCUMENTS

| | | |
|---|---|---|
| WO | WO 2007045112 A1 | 4/2007 |
| WO | WO 2013108718 A1 | 7/2013 |

* cited by examiner

SEMICONDUCTOR MODULE WITH A SUPPORTING STRUCTURE ON THE BOTTOM SIDE

CROSS-REFERENCES TO RELATED APPLICATIONS

This application is the U.S. National Stage of International Application No. PCT/EP2017/082992, flied Dec. 15, 2017, which designated the United States and has been published as International Publication No. WO 2018/114651 and which claims the priority of European Patent Application, Serial No. 16205389.6, filed Dec. 20, 2016, pursuant to 35 U.S.C. 119(a)-(d).

BACKGROUND OF THE INVENTION

The present invention relates to a semiconductor module,
wherein the semiconductor comprises a substrate made from an electrically insulating material,
wherein a structured metal layer, via which at least one electrical component is contacted, is applied to a top side of the substrate,
wherein the structured metal layer is applied to the substrate only in a central region of the substrate such that an edge region surrounding the central region and in which the structured metal layer is not applied to the substrate is left on the top side of the substrate,
wherein a contact layer for contacting a cooling body and which is situated opposite the structured metal layer is applied to a bottom side of the substrate in the central region.

Semiconductor modules of this type are generally known. Reference can be made, for example, to US 2016/0 021 729 A1.

A semiconductor module is known from US 2009/0 213 546 A1 which comprises a substrate made from an electrically insulating material. A structured metal layer, via which at least one electrical component is contacted, is applied to a top side of the substrate. The structured metal layer is applied to the whole top side. A contact layer for contacting a cooling body is applied to a bottom side of the substrate, essentially coinciding with the structured metal layer.

A semiconductor module is known from US 2014/0 204 533 A1 which comprises a substrate made from an electrically insulating material. A structured metal layer, via which at least one electrical component is contacted, is applied to a top side of the substrate. The structured metal layer appears to be applied to the substrate only in a central region of the substrate such that an edge region surrounding the central region and in which the structured metal layer is not applied to the substrate is left on the top side of the substrate. A contact layer for contacting a cooling body is applied to a bottom side of the substrate. It is not explicit from US 2014/0 204 533 A1 in which region of the bottom side the contact layer is applied to the bottom side.

A semiconductor module is known from US 2010/0 302 741 A1 which comprises a substrate made from an electrically insulating material. A structured metal layer, via which at least one electrical component is contacted, is applied to a top side of the substrate. The structured metal layer is applied to the substrate only in a central region of the substrate such that an edge region surrounding the central region and in which the structured metal layer is not applied to the substrate is left on the top side of the substrate. A contact layer for contacting a cooling body and which is situated opposite the structured metal layer is applied to a bottom side of the substrate, in the central region and also slightly beyond it.

A semiconductor module is known from US 2013/0 056 185 A1 which comprises a substrate made from an electrically insulating material. A structured metal layer, via which at least one electrical component is contacted, is applied to a top side of the substrate. The structured metal layer is applied to the substrate only in a central region of the substrate such that an edge region surrounding the central region and in which the structured metal layer is not applied to the substrate is left on the top side of the substrate. A contact layer for contacting a cooling body and which is situated opposite the structured metal layer is applied to a bottom side of the substrate. The contact layer appears to extend over the whole bottom side.

The semiconductor modules can, within the scope of the present invention, in particular take the form of power semiconductor modules and comprise, as an electrical component, a power semiconductor, for example an IGBT or a similar component, for example a power MOFSET. Semiconductor modules of this type can be used, for example, in electric cars for switching the energy supply of traction motors. The semiconductor modules can also comprise, as an electrical component, for example a power LED or a resistor.

Within the scope of producing the semiconductor module, pressure is often exerted on the top side of the substrate in a substep by means of a pressing tool. The pressure on the top side is often exerted by the pressing tool via a flexible compensatory material. At the same time as the pressure is exerted, the substrate is held on its bottom side by means of a holding element. Exposure to an elevated temperature, for example in a sintering process, often also takes place in conjunction with the exertion of the pressure.

Because the substrate protrudes beyond the structured metal layer, as part of the abovementioned substep compressive forces are also exerted on the edge region. If the contact layer is applied to the bottom side of the substrate only in the central region, considerable bending forces are often exerted on the transition between the central region and the edge region. In particular because of the high brittleness of the substrate which often exists, this can result in the substrate fracturing. The bending forces can also cause tears in the substrate which, although they may not be noticed initially, later cause premature failure of the semiconductor module.

It is conceivable to design the form of the holding element in such a way that its side facing the bottom side of the substrate has an elevated portion in the edge region such that the holding element supports the substrate not only in the region of the contact layer but also in the edge region. However, this requires a special design, adapted to the respective substrate, of the holding element. This procedure is inefficient in particular in the case of small production runs. Furthermore, in this case the substrate must be positioned precisely relative to the holding element. It is furthermore difficult to manufacture the substrate with the precision required for such a design of the holding element. For example, the thickness of the contact layer can thus be subject to variations from substrate to substrate.

It is furthermore conceivable to design the substrate accordingly with a thickness such that the bending forces remain within the tolerance range. Owing to the greater thickness of the substrate, however, in this case the thermal resistance of the substrate increases such that it is more difficult to reduce the heat of the semiconductor element.

It is furthermore known from the prior art to extend the contact layer over the whole bottom side. By virtue of this procedure, elevated bending stresses owing to the processing pressure are avoided during the production of the semiconductor module. However, on the one hand, air gaps which are required for reliable operation are reduced. Furthermore, the material from which the contact layer is made generally has a different coefficient of thermal expansion from the substrate. When there is a change in temperature, which is inevitable during operation, this results hi a bimetallic effect and hence in warping of the semiconductor module. Such warping can result, for example, in a reduced contact surface area with a cooling body and hence in a reduced cooling of the semiconductor module. In an extreme case, the warping can even cause the substrate to fracture. Other effects such as, for example, pumping of auxiliary or operating materials such as, for example, a heat-conducting paste can also occur.

SUMMARY OF THE INVENTION

The object of the present invention consists in providing a semiconductor module in which an excessively high bending stress is easily and reliably avoided both during the production of the semiconductor module and when the semiconductor module is operating.

The object is achieved by a semiconductor module which includes a substrate made from an electrically insulating material, wherein a structured metal layer, via which at least one electrical component is contacted, is applied to a top side of the substrate, wherein the structured metal layer is applied to the substrate only in a central region of the substrate such that an edge region surrounding the central region and in which the structured metal layer is not applied to the substrate is left on the top side of the substrate, wherein a contact layer for contacting a cooling body and which is situated opposite the structured metal layer is applied to the bottom side of the substrate in the central region, wherein a structured supporting structure, the thickness of which corresponds to the thickness of the contact layer, is applied to the bottom side of the substrate in the edge region.

Advantageous embodiments of the semiconductor module are the subject of dependent claims.

According to the invention, a semiconductor module of the type mentioned at the beginning is configured such that a structured supporting structure, the thickness of which corresponds to the thickness of the contact layer, is applied to the bottom side of the substrate in the edge region.

As a result, it is ensured as part of the production of the semiconductor module that the substrate is also supported in the edge region against the compressive forces exerted by the pressing tool. Warping can therefore not occur at all or at least only to a limited extent. Vibrations can be reduced in the subsequent operation of the semiconductor module owing to the structured supporting structure. By virtue of the structuring of the supporting structure, it is however possible to minimize bending forces which occur owing to changes in temperature during operation. Furthermore, it can be prevented during the operation of the semiconductor module that undesired mechanical contacts or even fracture of the substrate occurs because of vibrations.

In a preferred embodiment of the semiconductor module, the supporting structure is separate from the contact layer. Creepage paths and air gaps can consequently be maintained or maximized.

The supporting structure preferably has a plurality of structure elements, wherein either only a bridging structure with a significantly reduced thickness compared with the structure elements is situated between the structure elements or the structure elements are completely separate from one another. By virtue of this embodiment, bending forces which occur during the operation of the semiconductor module are minimized to a particularly large extent.

The structure elements preferably extend in each case only over part of the length and the width of the bottom side. This embodiment in particular causes bending forces effected by a single one of the structure elements to act only on a limited region of the substrate. The structure elements can in particular in each case form a plurality of rows lengthwise and widthwise on the bottom side.

A notch effect can occur in the transition region between the supporting structure and the regions in which only the bridging structure is present or the structure elements are completely separate from one another. With respect to any part region of the supporting structure, the supporting structure preferably has an initial cross-section at its end facing the bottom side and a remaining cross-section at its end facing away from the bottom side, and furthermore the cross-section decreases at first monotonously the greater the distance from the bottom side until the cross-section has a minimum cross-section. The decrease can in particular be strictly monotonous. The minimization of the notch effect can be further optimized by the decrease of the cross-section being at its maximum on the bottom side and being more gradual the greater the distance from the bottom side.

In a particularly preferred embodiment, the cross-section increases again the greater the distance from the bottom side. The increase can in particular be strictly monotonous. By virtue of this embodiment, the contact surface area with the holding element, and later with a cooling body, can be maximized. Similarly to the abovementioned decrease, the increase can be at its minimum in the vicinity of the minimum cross-section and increase the greater the distance from the bottom side.

An auxiliary material can be introduced between the structure elements. By virtue of this embodiment, the heat transfer from the bottom side of the substrate to a cooling body placed on the contact layer can, for example, be optimized. In this case, gaps between the structure elements can furthermore serve as buffer storage areas for temporarily receiving the auxiliary material during the operation of the semiconductor module.

BRIEF DESCRIPTION OF THE DRAWINGS

The afore-described properties, features, and advantages of this invention and the fashion in which these are realized will become clearer and more comprehensible, in conjunction with the following description of the exemplary embodiments which are explained in detail in connection with the drawings, in which, shown schematically.

DETAILED DESCRIPTION OF PREFERRED EMBODIMENTS

Figure 1:
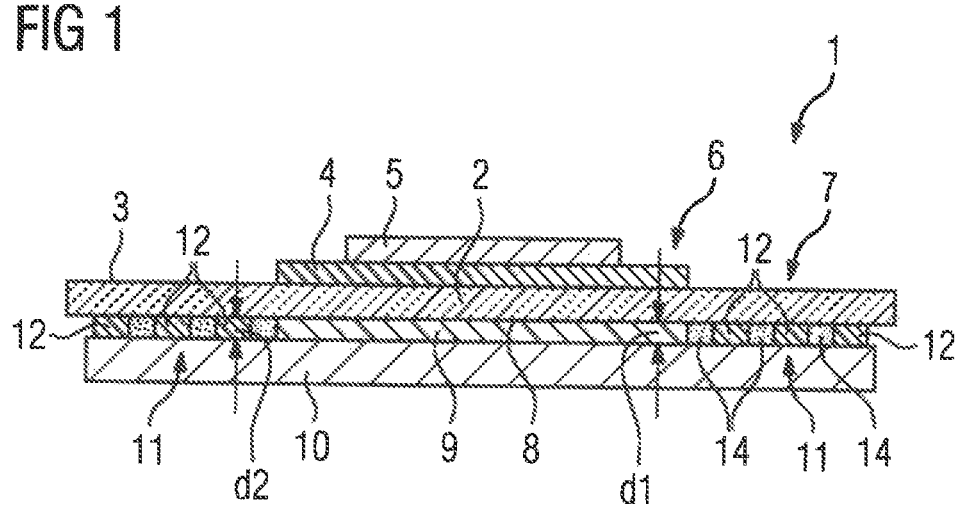
FIG. 1 shows a cross-section through a semiconductor module.

According to FIG. 1, a semiconductor module 1 has a substrate 2. The substrate 2 is made from an electrically insulating material. The substrate 2 can, for example, be made from aluminum nitride (AlN), aluminum oxide ($Al_2O_3$), silicon nitride ($Si_3N_4$), or a different ceramic material.

Figure 2:
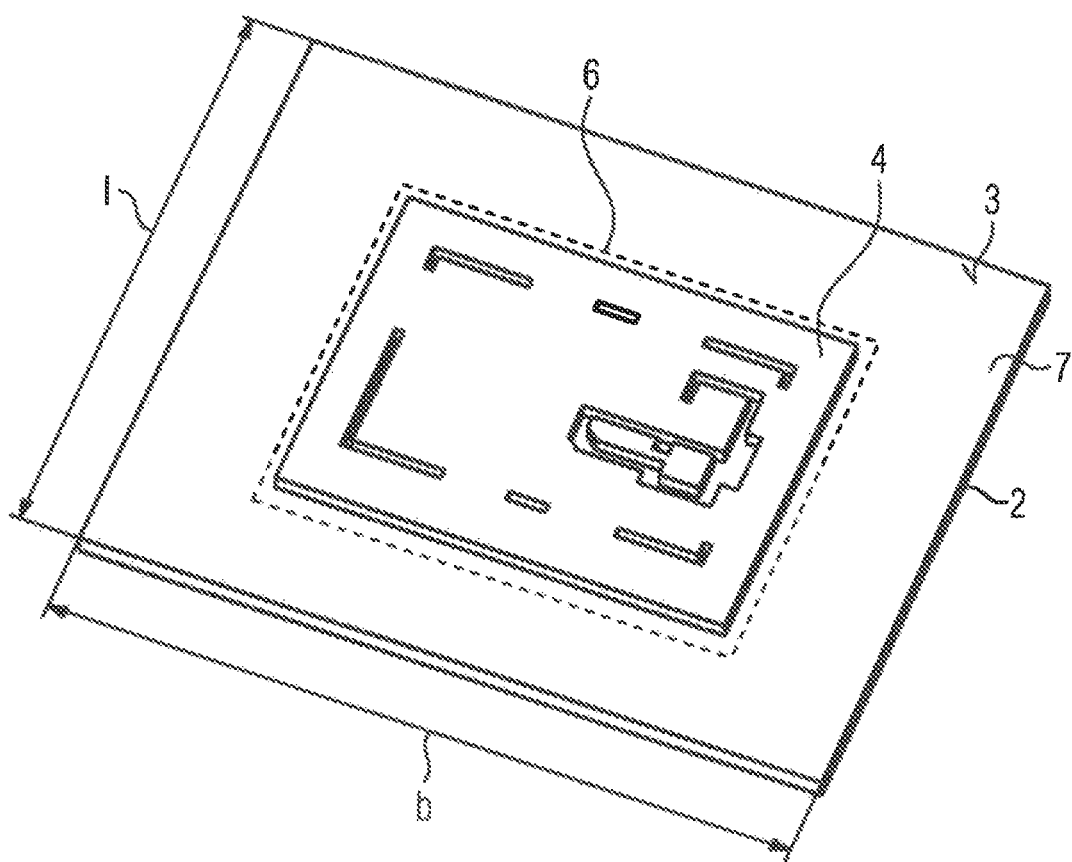
FIG. 2 shows a plan view of a top side of a substrate.

According to FIGS. 1 and 2, a structured metal layer 4 is applied to a top side 3 of the substrate 2. The metal layer 4 is generally made from copper. Alternatively, the metal layer 4 can be made, for example, from aluminum. The metal layer 4 can also for its part comprise a plurality of layers, in particular an aluminum layer applied directly to the top side 3 of the substrate 2 and a copper layer applied to the aluminum layer. At least one electrical component 5, for example an IGBT or a MOSFET, is electrically and thermally contacted via the structured metal layer 4. The mechanical, electrical, and thermal contacting is generally effected via a solder layer, sintered layer, conductive adhesive layer, or the like (not shown in the figure). The structured metal layer 4 is applied to the substrate 2 only in a central region 6 of the substrate 2. An edge region 7, which surrounds the central region 6, is thus left on the top side 3 of the substrate 2. The structured metal layer 4 is not applied to the substrate 2 in the edge region 7.

Figure 3:
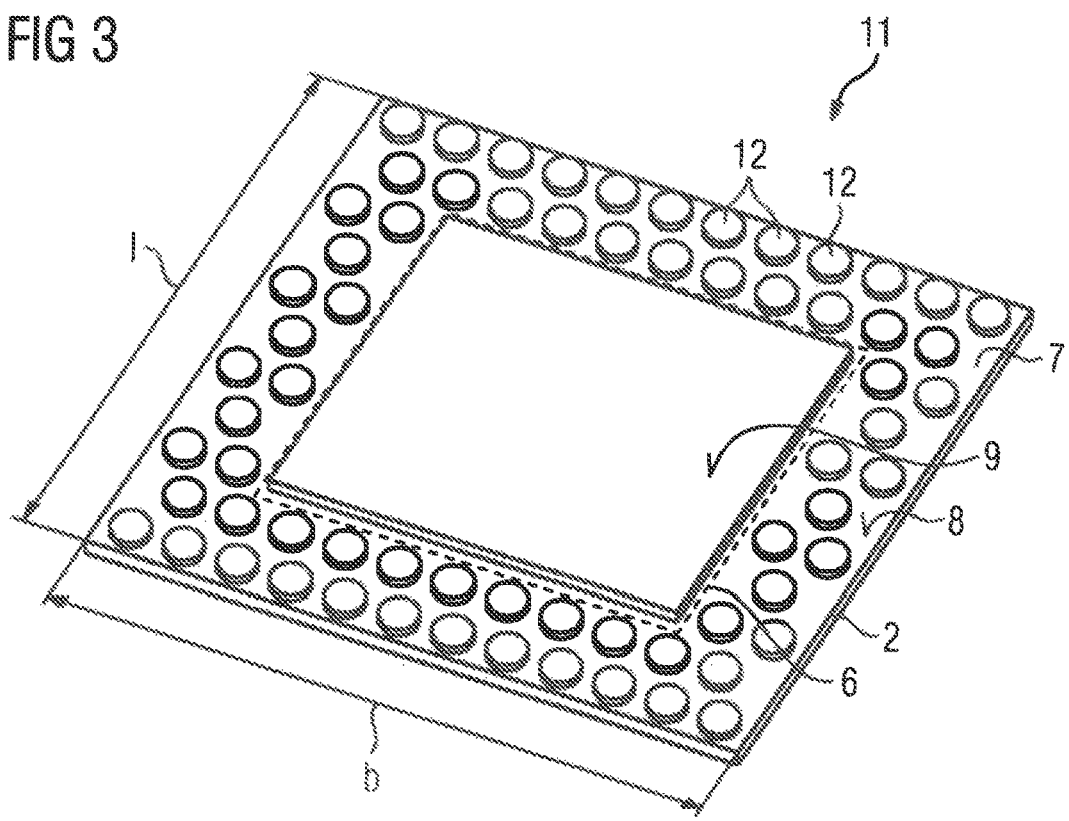
FIG. 3 shows a plan view of a bottom side of the substrate.

According to FIGS. 1 and 3, a contact layer 9 is applied in the central region 6 to a bottom side 8 of the substrate 2. The contact layer 9 serves to contact a cooling body 10. The contact layer 9 is situated opposite the structured metal layer 4. It is thus situated in the central region 6. According to the view in FIG. 3, it can be unstructured. The contact layer 9 can, similarly to the structured metal layer, also be made from metal. The above embodiments of the possible materials of the structured metal layer 4 also apply analogously for the contact layer 9. The contact layer 9 has a thickness d1.

The substrate 2 including the structured metal layer 4 and the contact layer 9 is preferably designed as a so-called DBC (direct bonded copper) substrate or AMB (active metal brazing) substrate.

Furthermore, according to the view in FIGS. 1 and 3, a structured supporting structure 11 is applied to the bottom side 8 of the substrate 2 in the edge region 7. The structured supporting structure 11 has a thickness d2. The thickness d2 corresponds, at least essentially, to the thickness d1 of the contact layer 9. The two thicknesses d1, d2 are ideally the same. However, in many cases it is acceptable or in some circumstances even advantageous if the thickness d2 is slightly, no more than 20% and preferably no more than 10%, greater or smaller than the thickness d1.

The structuring of the supporting structure 11 means that the supporting structure 11 is not present as a closed layer and instead is interrupted. The supporting structure 11 thus has a plurality of structure elements 12.

The manner of the structuring can take different forms. It is thus, for example, possible for the supporting structure 11 to be designed in the form of meanders, rhombuses, squares, or different types of supporting structures 11 with coherent structure elements 12. In particular in these cases, the individual structure elements 12 of the supporting structure 11 can be directly interconnected. In this case, although the supporting structure 11 forms a coherent structure, the coherent structure forms a relatively filigree pattern which only partially fills the edge region 7. However, in this case the fill level, i.e. the ratio between the surface area of the edge region 7 taken up by the supporting structure 11 and the total surface area of the edge region 7, is relatively low. It is generally no greater than 20% and usually even no greater than 10%. Alternatively, according to the view in FIGS. 1 and 3, it is possible for the structure elements 12 to be completely separate from one another. In this case too, the fill level can have a relatively low value, for example no greater than 20% or even no greater than 10%. In the case of structure elements 12 separated from one another, however, the fill level can also have a higher value, for example 30%, 50% or in individual cases also greater than 50%.

Figure 4:
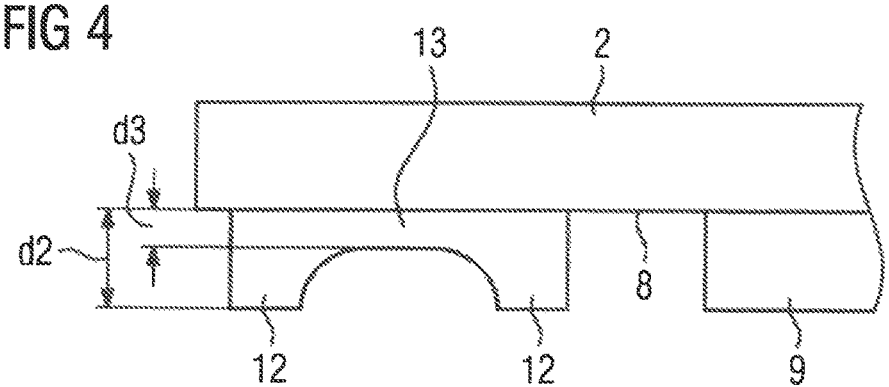
FIG. 4 shows a possible design of a supporting structure.

According to the schematic view in FIG. 4, it is possible for a bridging structure 13 to be located between the structure elements 12. In this case, however, the bridging structure 13 has a thickness d3 which is significantly reduced compared with the thickness d2 of the structure elements 12. The reduction is at least 50%, preferably at least 80% of the thickness d2. In this case, for example a uniform layer can have first been applied to the bottom side 8, from which material was then removed in the region of the bridging structure 13. The regions in which no material was removed in this case forms the supporting structure 11. It is alternatively possible that there is no bridging structure 13 present. In particular, the material applied beforehand as a uniform layer can, for example, be completely removed in the region between the structure elements 12 of the supporting structure 11.

As already mentioned, the individual structure elements 12 of the supporting structure 11 can be directly interconnected, in this case, the structure elements 12 are only partially surrounded by the bridging structure 13 which may be present. However, according to the view in FIGS. 1 and 3, the structure elements 12 are preferably separated from each other such that they are completely surrounded by the bridging structure 13 which may be present.

The structure elements 12 preferably extend, according to the view in FIG. 3, in each case only over part of the length l and the width b of the bottom side 8. In particular, according to the view in FIG. 3, the structure elements 12 can form a plurality of rows lengthwise and widthwise respectively on the bottom side 8.

In the view according to FIG. 3, the structure elements 12 have a circular cross-section. Alternatively, the structure elements 12 could also be designed as rings, i.e. have a circular cross-section with a central, likewise circular recess. Structure elements 12 can also be designed, for example, as ovals or as ellipses, with or without a central recess, and possibly also as angular structures (squares, hexagons, etc), with or without a central recess. The list is of course given purely by way of example.

Figure 5:
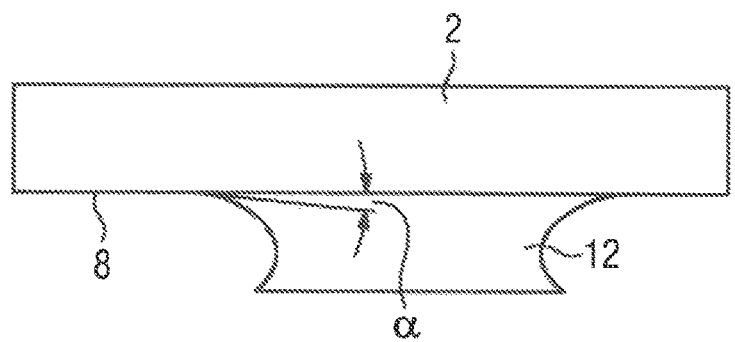
FIG. 5 shows a possible design of a structure element.

It is possible for the cross-section of the individual structure elements 12 to remain constant the greater the distance from the bottom side 8. If, according to the view in FIG. 3, purely by way of example, the structure elements 12 have a circular cross-section, the structure elements 12 would in this case also be circular in design. However, the structure elements 12 preferably have an initial cross-section at their end facing the bottom side and a remaining cross-section at their end facing away from the bottom side 8, wherein the cross-section furthermore initially decreases monotonously the greater the distance from the bottom side 8. The decrease can in particular be strictly monotonous. If, according to the view in FIG. 3, purely by way of example, the cross-sections are circular, the structure elements 12 could in this case thus be designed, for example, in the manner of truncated cones. It is even more preferable if the decrease in the cross-section is at the maximum on the bottom side 8 and is more gradual the greater the distance from the bottom side 8. If, according to the view in FIG. 3, purely by way of example, the cross-sections are circular, the structure elements 12 could in this case thus be designed, according to the view in FIG. 5, like a volcano cone in the vicinity of the bottom side 8. It is hereby optimal if the structure elements 12 extend almost completely flat at their end facing the bottom side 8. An angle α which the structure elements 12 have on the bottom side 8 should therefore be as small as possible.

The cross-section decreases until the cross-section has a minimum cross-section. Then, the greater the distance from the bottom side 8, the cross-section can remain constant. The cross-section preferably increases monotonously again. Similarly to the previous decrease in the cross-section, the increase can in particular be strictly monotonous. However, the increase in the cross-section is generally less than the previous decreases in the cross-section. The remaining cross-section is therefore generally smaller than the initial cross-section.

The above preferred embodiments explained in connection with an individual structure element 12 do not apply only to the individual structure elements 12. They preferably apply to any part region of the supporting structure 11.

In particular when, although the supporting structure 11 forms a coherent structure, the coherent structure 11 forms a filigree pattern, it is possible for the supporting structure 11 also to be connected to the contact layer 9. However, the supporting structure 11 is preferably separate from the contact layer 9 and therefore does not contact the latter directly. Creepage paths and air gaps can in particular be maximized by this embodiment.

According to the view in FIG. 1 it is possible for an auxiliary material 14 to be introduced between the structure elements 12. The auxiliary material 14 can, for example, be a heat-conducting paste. As a result, the transfer of heat from the substrate 2 and consequently from the semiconductor module 1 can be maximized.

In summary, the present invention thus relates to the following subject matter:

A semiconductor module 1 has a substrate 2 made from an electrically insulating material. A structured metal layer 4, via which at least one electrical component 5 is contacted, is applied to a top side 3 of the substrate 2. The structured metal layer 4 is applied to the substrate 2 only in a central region 6 of the substrate 2 such that an edge region 7, surrounding the central region 6 and in which the structured metal layer 4 is not applied to the substrate 2, is left on the top side 3 of the substrate 2. A contact layer 9 for contacting a cooling body 10 and which is situated opposite the structured metal layer 4 is applied to a bottom side 8 of the substrate 2 in the central region 6. Furthermore, a structured supporting structure 11 with a thickness d2 corresponding to the thickness d1 of the contact layer 9 is applied to the bottom side 8 of the substrate 2 in the edge region 7.

The present invention has many advantages. In particular, significantly improved processing is possible. Risk of the substrate 2 fracturing is avoided. The vibration and shock resistance is increased during operation. The heat transfer to the cooling body 10 can be improved.

Although the invention has been illustrated and described in detail by the preferred exemplary embodiment, the invention is not limited by the disclosed examples and other variations can be readily deduced by a person skilled in the art without going beyond the scope of protection of the invention.

What is claimed is:

1. A semiconductor module comprising:
    a substrate made from electrically insulating material;
    a structured metal layer for making contact with an electrical component, said structured metal layer being applied to a too side of the substrate only in a central region of the substrate such that an edge region in surrounding relation to the central region is left on the top side of the substrate and in which the structured metal layer is not applied to the substrate;
    a contact layer for contacting a cooling body, said contact layer being applied to a bottom side of the substrate in the central region in opposition to the structured metal layer; and
    a structured supporting structure applied to the bottom side of the substrate in the edge region and having a thickness which corresponds to a thickness of the contact layer, wherein, with respect to any part region of the supporting structure, the supporting structure has an initial cross-section at an end facing the bottom side and a remaining cross-section at an end facing away from the bottom side, wherein a cross-section of the supporting structure decreases monotonously as a distance of the supporting structure increases from the bottom side until the cross-section is at a minimum.

2. The semiconductor module of claim 1, wherein the supporting structure is separate from the contact layer.

3. The semiconductor module of claim 1, wherein the supporting structure includes a plurality of structure elements and a bridging structure which is situated between the structure elements and has a thickness which is less than a thickness of the structure elements, or the supporting structure includes a plurality of structure elements which are completely separate from one another.

4. The semiconductor module of claim 3, wherein the structure elements are each sized to extend only over part of a length and a width of the bottom side.

5. The semiconductor module of claim 4, wherein the structure elements each form a plurality of rows lengthwise and widthwise on the bottom side.

6. The semiconductor module of claim 1, wherein a decrease of the cross-section is at a maximum on the bottom side and is more gradual the greater the distance from the bottom side.

7. The semiconductor module of claim 1, wherein, starting from the minimum cross-section, the cross-section increases again monotonously, the greater the distance from the bottom side.

8. The semiconductor module of claim 7, wherein an increase of the cross section is at a minimum in a vicinity of the minimum cross-section and increases the greater the distance from the bottom side.

9. The semiconductor module of claim 3, further comprising an auxiliary material introduced between the structure elements.

* * * * *

UNITED STATES PATENT AND TRADEMARK OFFICE
CERTIFICATE OF CORRECTION

PATENT NO. : 10,699,984 B2
APPLICATION NO. : 16/471472
DATED : June 30, 2020
INVENTOR(S) : Stephan Neugebauer, Stefan Pfefferlein and Ronny Werner Page 1 of 1

It is certified that error appears in the above-identified patent and that said Letters Patent is hereby corrected as shown below:

On the Title Page

On page 2, under [56] US PATENT DOCUMENTS:
Replace "2009/02135460" with the correct --2009/0213546--.
Replace "2010/03027410" with the correct --2010/0302741--.
Replace "2014/02045330" with the correct --2014/0204533--.

Signed and Sealed this
Twenty-fifth Day of August, 2020

Andrei Iancu
*Director of the United States Patent and Trademark Office*